United States Patent
Mayer

(10) Patent No.: US 6,181,745 B1
(45) Date of Patent: Jan. 30, 2001

(54) PROCESS FOR MONITORING THE QUANTIZATION QUALITY IN DIGITAL RADIO OR TELEVISION TRANSMISSION SYSTEMS

(75) Inventor: Joerg Mayer, Stuttgart (DE)

(73) Assignee: Robert Bosch GmbH, Stuttgart (DE)

( * ) Notice: Under 35 U.S.C. 154(b), the term of this patent shall be extended for 0 days.

(21) Appl. No.: 08/913,599

(22) PCT Filed: Mar. 9, 1996

(86) PCT No.: PCT/DE96/00428

§ 371 Date: Jan. 16, 1998

§ 102(e) Date: Jan. 16, 1998

(87) PCT Pub. No.: WO96/29789

PCT Pub. Date: Sep. 26, 1996

(30) Foreign Application Priority Data

Mar. 17, 1995 (DE) .............................................. 195 09 117

(51) Int. Cl.$^7$ ....................................................... H04N 7/12
(52) U.S. Cl. ................... 375/240.03; 375/243; 341/200; 382/251
(58) Field of Search .............................. 375/240.03, 243, 375/245; 348/406.1; 341/200; 382/251, 252

(56) References Cited

U.S. PATENT DOCUMENTS

| | | | |
|---|---|---|---|
| 4,859,883 | * 8/1989 | Bradinal | 327/311 |
| 5,027,119 | * 6/1991 | Toyomaki | 341/144 |
| 5,351,048 | * 9/1994 | Yamasaki | 341/110 |
| 5,493,297 | * 2/1996 | Nguyen et al. | 341/118 |
| 5,548,343 | * 8/1996 | Paquier et al. | 348/691 |
| 5,621,407 | * 4/1997 | Jeong et al. | 341/143 |
| 5,664,056 | * 9/1997 | Akagiri | 704/229 |
| 5,678,198 | * 10/1997 | Lemson | 455/67.1 |
| 5,802,218 | * 9/1998 | Brailean | 382/275 |
| 5,977,896 | * 11/1999 | Kohdaka et al. | 341/143 |

FOREIGN PATENT DOCUMENTS

402104128A * 4/1990 (JP) .................................. H04N/7/13

OTHER PUBLICATIONS

"Adaptive Quantizer", IBM Technical Disclosure Bulletin, vol. 9, Iss. 6, Nov. 1, 1996, pp. 621–623.*

* cited by examiner

Primary Examiner—Vu Le
(74) Attorney, Agent, or Firm—Kenyon & Kenyon

(57) ABSTRACT

In order to monitor the transmission quality of digitized signals, the quantization interference power is measured in a region where no useful signal is being transmitted. The quantization step for an associated D/A converter can be determined from the quantization interference power, and an assessment can be made, based on a comparison, as to whether the D/A converter is meeting the required quality parameters.

4 Claims, 2 Drawing Sheets

PROCESS FOR MONITORING THE QUANTIZATION QUALITY IN DIGITAL RADIO OR TELEVISION TRANSMISSION SYSTEMS

FIELD OF THE INVENTION

The present invention relates to a method for monitoring a transmission quality of digitized signals that have been subjected to a quantizing operation.

BACKGROUND INFORMATION

Reference signals, for example the test lines in a television image, can be utilized to measure the signal-to-noise ratio of, for example, a digitized television image. This procedure requires, however, a complex and expensive test receiver with corresponding measurement technology. The monitoring of pilot signals requires a similar outlay.

A method for determining the quantization distortion of transmission devices is described in European Patent Application No. 0 030 383, where a certain frequency band is provided at the transmitter end and fed into a transmission device. At the receiver end, a level measurement is performed within a transmitter-end frequency band, along with a measurement outside that frequency band. The quantization noise ratio is determined from a difference between these two measurements.

A method for determining signal power and distortion power is described in European Patent Application No. 0 069 972. Two signals are generated; the first digital signal is transmitted directly to a receiver end; the second signal is initially conveyed to a codec. The distortion power is determined from samples of the received signals. German Patent Application No. 29 45 034 describes an arrangement for measuring a ratio of a signal distortion to a quantization distortion. Two level meters are used to determine the difference between a reference signal and a noise signal containing the quantization distortion.

SUMMARY OF THE INVENTION

According to a method of the present invention, digitized signals can be evaluated, in simple fashion and during transmission, in terms of their transmission quality. No interruption in service is required. It can be easily evaluated as to whether a D/A converter provided in the transmission path is operating properly.

The invention is based on the following realizations: The achievable transmission quality of a digitized signal, e.g. the signal-to-noise ratio, is directly proportional to the resolution of an associated D/A converter located in the transmission path, and the maintenance of its quality parameters. The present invention provides that in the uniform quantization of an analog signal during A/D conversion, given sufficient modulation (generally >6 bits for a sine carrier or for multi-tone signals such as those which occur with television distribution services), the finite number of quantization steps results in an error having a property of Gaussian white Gaussian noise. This white noise is uniformly distributed over the entire Nyquist spectrum, i.e. even in the frequency regions in which no useful signal is being transmitted. By measuring a mean of the quantization interference power in these regions, the quantization step for the associated D/A converter can be determined and compared with an expected value. If there is an impermissibly large difference between the determined quantization step and the expected value, an error signal is transmitted, for example via remote control devices, to a central display.

Thus, a plurality of D/A converters, for example in a television distribution network, can be monitored during operation in terms of their respective transmission quality. At the same time, data can be gathered regarding the long-term stability of the D/A converter.

DETAILED DESCRIPTION OF THE INVENTION

Figure 2:
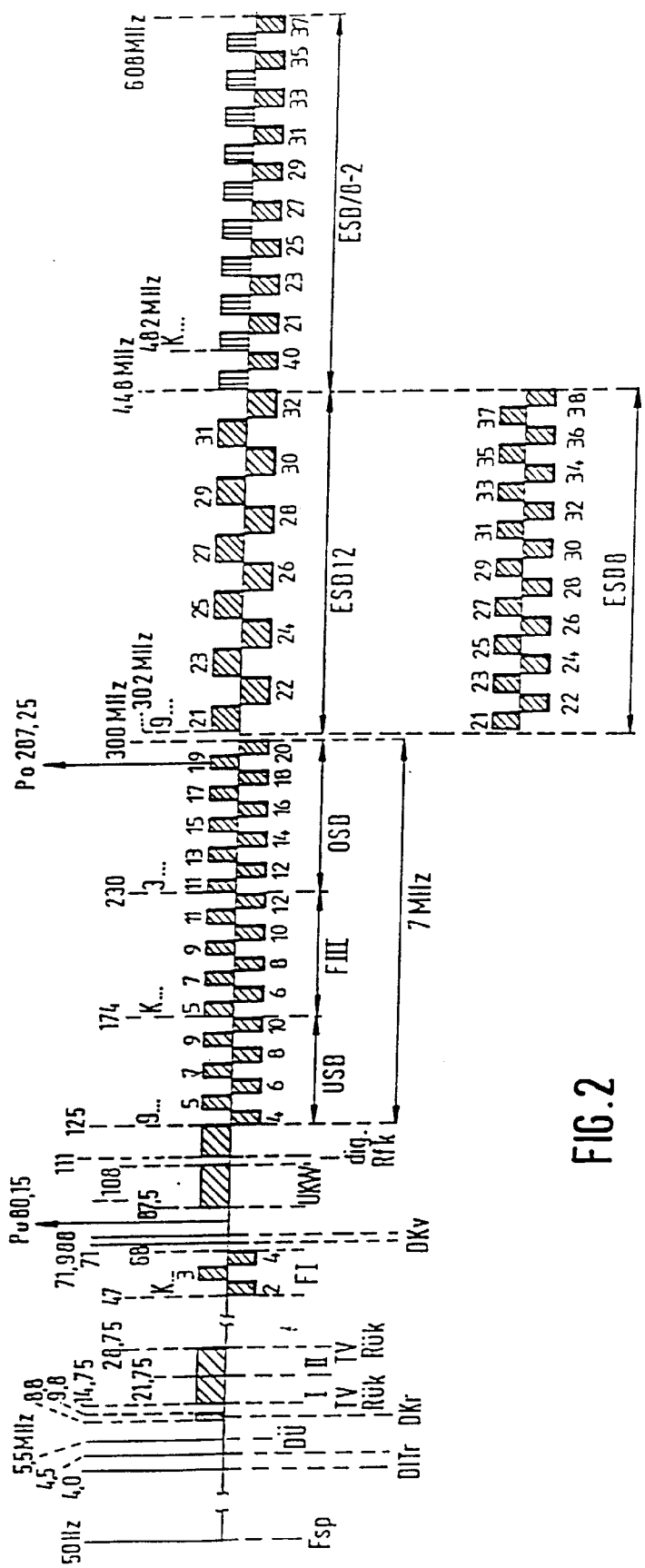
FIG. 2 shows a location of the radio and television channels in a broad-band communications network.

In a distribution network for radio and television signals, the radio and television signals are transmitted, for example, in a digitized frequency-multiplexed signal form on optical fiber cables GF and, at the subscriber location TLN, converted by a fast D/A converter back into an analog frequency-multiplexed signal form that can be processed by commercially available radio and/or television receivers. An example of a frequency-multiplexed signal is shown in FIG. 2.

Figure 1:
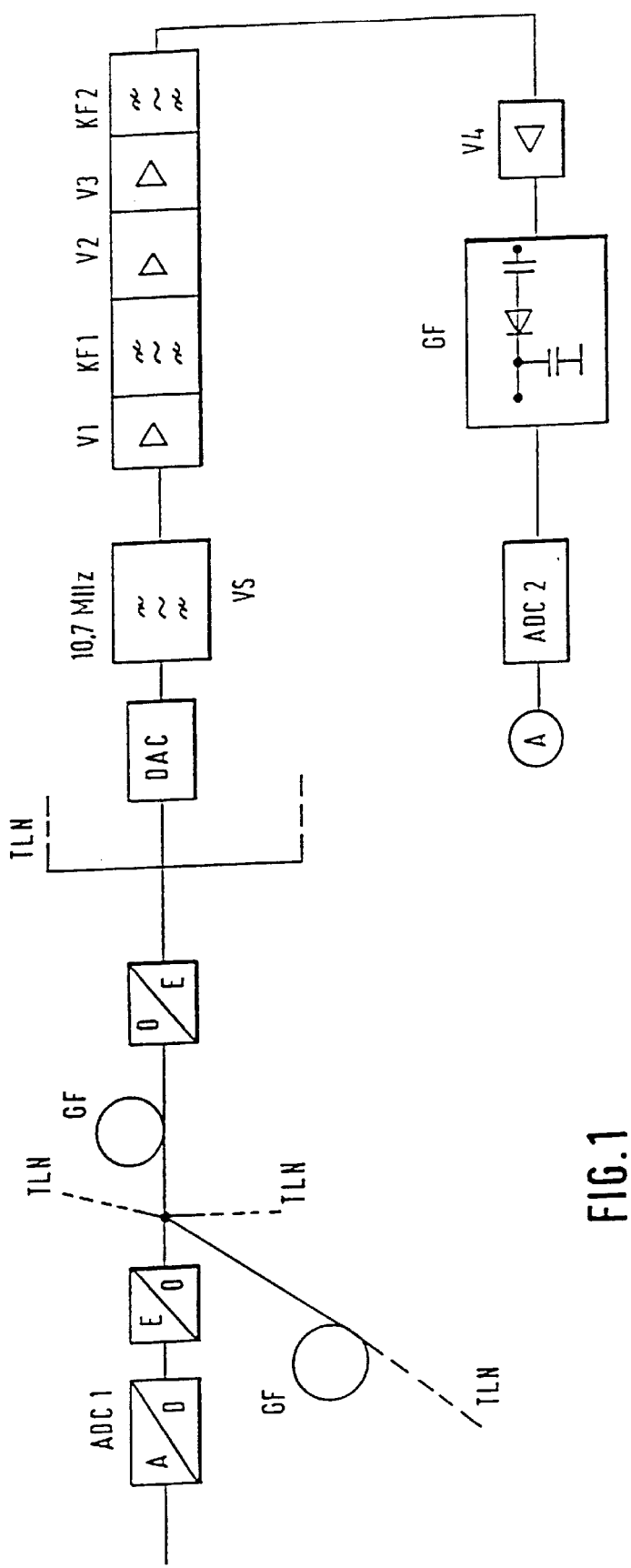
FIG. 1 shows a process diagram for a quality checking of a D/A converter according to the present invention.

Since the signal-to-noise ratio of the digitized transmitted signals that have been subjected to a quantizing operation is directly proportional to the resolution of the D/A converter, quality checking can be confined to that parameter. As previously discussed, it is assumed that in the uniform quantization of an analog signal during transmission-end A/D conversion—ADC1 in FIG. 1—assuming sufficient modulation (generally >6 bits for sine carriers or multi-tone signals), the finite number of quantization steps results in an error having the property of white noise. The general equation describing the average quantization interference power or quantization noise power (lecture text, Prof. Dr.Ing. W. Kaiser, Übertragungstechnik II., Transmission Technology II University of Stuttgart, 1982, pp. 229 to 230) is:

$$P_q = (a^2/12),$$

where a corresponds to one quantization step.

The noise produced as a result, which is added to other noise sources such as thermal noise, is uniformly distributed over the entire Nyquist spectrum, i.e. even at points where no useful signal is transmitted. The quantization step a can be determined by measuring the mean quantization interference power, which of course must be greater than any other noise components.

One point which is not occupied by the useful spectrum is the frequency 10.7 MHz (or 5.5 MHz or 450 kHz). A sensitive, highly selective amplifier can be constructed at these frequencies, since suitable filters are available. The following quantitative values apply to an implemented television distribution system. For a D/A converter with 12-bit resolution and an output voltage of 1 Vss into 50 ohms, one quantization step corresponds to a voltage of is $$(1Vss/2^{12}) = 244 \text{ uV}$$

This corresponds to a mean quantization interference power $$P_q = (a^2/12)\Delta = 4.9e^{-9} \text{ W} = -76 \text{ dBm}.$$

This interference power is distributed over the entire Nyquist bandwidth, i.e. half the sampling frequency, or $$(452 \text{ MHz}/2) = 226 \text{ MHz}.$$

Since measurements are made only within a bandwidth of 300 kHz around 10.7 MHz, 5.5 MHz, or 450 kHz, the expected interference power must be corrected by $$10 \log (300 \text{ kHz}/226 \text{ MHz}) = -28.7 \text{ dBm}.$$

The expected interference power, referred to a bandwidth of 300 kHz, is thus $$P_{q300} = -76 \text{ dBm} - 28.7 \text{ dBm} = -104.7 \text{ dBm}.$$

In the implemented distribution system, a degradation of the D/A converter to 8 bits should be detected. The expected interference power of an 8-bit D/A converter is $-104.7$ dBm$+4 \times 6$ dBm$=-80.7$ dBm. The output signal of the D/A converter DAV passes through a preselector VS to an amplifier V1 and then to a first ceramic filter KF1. Level preemphasis and adaptation to a second ceramic filter KF take place in amplifier stages V2 and V3. Following additional amplification V4, the noise signal, with a level of +4 dBm, is applied to a rectifier and integrator GF. An A/D converter ADC2 digitizes the interference voltage and conveys it, via a corresponding interface, to a system controller for analysis A.

In an exemplary embodiment of the method according to the present invention, analysis can be performed by a comparator which compares the signal being analyzed with an expected value determined for the D/A converter. In the exemplary embodiment, if a difference >=4 occurs, i.e. if the value falls below the expected resolution value a=12 by a value of four or more, an error signal is prepared and displayed.

The present invention makes possible a simple and economical monitoring of the signal-to-noise ratio of a D/A converter during operation. Further possible advantages can be realized by replacing the individual amplifiers with commercially available IF amplifiers. The measurement frequency can be changed by exchanging the ceramic filters. If a variable-frequency prefilter with oscillator and mixer stage is used, any desired region of the spectrum can be examined.

What is claimed is:

1. A method for monitoring a transmission quality of digitized signals subjected to a quantizing operation, comprising the steps of:

measuring a quantization interference power in a predetermined region, wherein no useful signal is transmitted in the predetermined region;

determining a quantization step for an associated D/A converter as a function of the quantization interference power;

comparing the quantization step with an expected value; and providing an error signal if the quantization step deviates from the expected value by a predetermined difference.

2. The method according to claim 1, wherein, when at least one of digitized radio signals and television signals are transmitting and when the difference between the quantization step and the expected value is at least four, the error signal corresponds to the expected value.

3. The method according to claim 1, wherein the step of measuring the quantization interference power is performed in a television signal distribution network having frequency-multiplexed signals with a frequency of 10.7 MHz.

4. The method according to claim 3, wherein the quantization interference power has a measurement bandwidth of 300 kHz.

* * * * *

UNITED STATES PATENT AND TRADEMARK OFFICE
CERTIFICATE OF CORRECTION

PATENT NO.    : 6,181,745 B1
DATED         : January 30, 2001
INVENTOR(S)   : Joerg Mayer It is certified that error appears in the above-identified patent and that said Letters Patent is hereby corrected as shown below:

Title page,
ABSTRACT, lines 10 and 11, delete -- and two paths --, and -- received signal paths, only one of --.
Lines 12 and 13, delete "(ENC1, ENC2, IF1, IF2, MODI, MOD2, DEM1, DEM2, DFI, DF2, DEC1, DEC2 --.

Column 1,
Line 23, change "this, publication" to -- this publication, --.
Line 48, delete -- by the Features of claim 1, --.

Signed and Sealed this

Ninth Day of April, 2002

Attest:

JAMES E. ROGAN
*Attesting Officer*    *Director of the United States Patent and Trademark Office*